United States Patent
Nakano et al.

(10) Patent No.: US 6,792,889 B2
(45) Date of Patent: Sep. 21, 2004

(54) PLASMA PROCESSING APPARATUS AND METHOD CAPABLE OF PERFORMING UNIFORM PLASMA TREATMENT BY CONTROL OF EXCITATION POWER

(75) Inventors: Akira Nakano, Miyagi-ken (JP); Tadahiro Ohmi, 2-1-17-301 Komegafukuro, Aoba-ku, Sendai-shi, Miyagi-ken (JP)

(73) Assignees: Alps Electric Co., Ltd., Tokyo (JP); Tadahiro Ohmi, Miyagi-ken (JP)

( * ) Notice: Subject to any disclaimer, the term of this patent is extended or adjusted under 35 U.S.C. 154(b) by 0 days.

(21) Appl. No.: 10/353,760

(22) Filed: Jan. 28, 2003

(65) Prior Publication Data

US 2003/0141821 A1 Jul. 31, 2003

(30) Foreign Application Priority Data

Jan. 30, 2002 (JP) .................................... 2002-022321
Jan. 30, 2002 (JP) .................................... 2002-022323

(51) Int. Cl.⁷ ............................................ B23K 10/00
(52) U.S. Cl. ............................... 118/723 E; 315/111.21
(58) Field of Search ............. 156/345.1, 345.35–345.39, 156/345.4–345.49; 315/111.21, 111.71, 111.81, 111.91; 118/723 E, 723 MA

(56) References Cited

U.S. PATENT DOCUMENTS

| 4,970,435 | A | * | 11/1990 | Tanaka et al. ........... 315/111.21 |
| 5,605,576 | A | * | 2/1997 | Sasaki et al. ............. 118/723 E |
| 5,665,166 | A | * | 9/1997 | Deguchi et al. .......... 118/723 E |
| 6,440,260 | B1 | * | 8/2002 | Denda et al. ................ 156/345 |

* cited by examiner

*Primary Examiner*—Wilson Lee
(74) *Attorney, Agent, or Firm*—Beyer Weaver & Thomas, LLP

(57) ABSTRACT

A plasma processing apparatus includes a chassis accommodating an impedance matching circuit. The impedance matching circuit is placed between an RF generator and a plasma excitation electrode. Magnetic probes for detecting a magnetic field generated at a slit in a sidewall of the chassis are placed axisymmetrically. The plasma processing apparatus also includes a feedback circuit for feeding back to an RF generator or a matching circuit so that a current detected by a current-detecting unit maintains a predetermined value.

19 Claims, 9 Drawing Sheets

PLASMA PROCESSING APPARATUS AND METHOD CAPABLE OF PERFORMING UNIFORM PLASMA TREATMENT BY CONTROL OF EXCITATION POWER

BACKGROUND OF THE INVENTION

1. Field of the Invention

The present invention relates to plasma processing apparatuses and plasma processing methods. More particularly, the present invention relates to a high-performance plasma processing apparatus that includes current-detecting means for measuring a discharge current flowing in the gap between an electrode pair during plasma discharge, that can confirm the uniform plasma treatment of a workpiece, and that can stabilize the effective electric power consumption in a plasma space, and to a plasma processing method using the apparatus.

2. Description of the Related Art

FIG. 7 shows a typical plasma processing apparatus that has been used for plasma processes, such as CVD (chemical vapor deposition), sputtering, dry etching, and ashing. Referring to FIG. 7, the plasma processing apparatus includes a pair of electrodes composed of a plasma excitation electrode 4 for forming a plasma and a susceptor electrode 8 that faces the plasma excitation electrode 4. A workpiece W is placed on the susceptor electrode 8. The plasma excitation electrode 4 is connected to a feeding terminal of an RF generator 1 with an RF feeder 3 and a matching circuit 2A therebetween. The matching circuit 2A matches the impedance between the RF generator 1 and the plasma excitation electrode 4. The matching circuit 2A is accommodated in a conductive chassis 120. Also, the RF feeder 3 and the plasma excitation electrode 4 are enclosed in a conductive housing 21.

RF power generated from the RF generator 1 is supplied to the plasma excitation electrode 4 via the matching circuit 2A and the RF feeder 3. A shower plate 5 with many openings 7 is provided below the plasma excitation electrode (cathode electrode) 4. An annular projection 4a abuts on the shower plate 5. A conductive gas inlet pipe 17 is connected to a space 6 provided between the plasma excitation electrode 4 and the shower plate 5. The gas inlet pipe 17 has an insulating component 17a at the middle thereof to electrically insulate the plasma excitation electrode 4 from the gas supply source. Gas introduced from the gas inlet pipe 17 is supplied through the openings 7 of the shower plate 5 into a chamber 60 surrounded by a chamber wall 10. The upper side of the chamber wall 10 and the circumference of the plasma excitation electrode 4 are hermetically sealed using an insulator 9.

The susceptor electrode 8 carrying the workpiece W, such as a wafer, is arranged in the chamber 60. The susceptor electrode 8 has a common discharge potential and is supported by a shaft 13. The lower portion of the shaft 13 and a chamber bottom 10A are hermetically connected to each other with conductive bellows 11. The chamber 60 is evacuated by an exhaust system (not shown).

Since the susceptor electrode 8 is vertically movable with the shaft 13 and the bellows 11, the distance between the plasma excitation electrode 4 and the susceptor electrode 8 is, therefore, adjustable, while the vacuum is maintained in the chamber 60. The lower portion of the shaft 13 is grounded as a common terminal, and the common terminal of the RF generator 1 is also grounded. The chamber wall 10 and the shaft 13 have the same DC potential.

The matching circuit 2A is disposed between the RF generator 1 and the RF feeder 3. The matching circuit 2A matches the impedance between the RF generator 1 and the plasma excitation electrode 4 in accordance with changes in the plasma within the chamber 60. Thus, the matching circuit 2A generally includes a plurality of passive devices. Specifically, referring to FIG. 8, the matching circuit 2A includes three types of passive devices: a load capacitor 22 (a vacuum variable capacitor), an inductance coil 23, and a tuning capacitor 24 (an air variable capacitor). In the drawing, one inductance coil 23 is connected between the load capacitor 22 and the tuning capacitor 24.

For etching and film deposition using the plasma processing apparatus mentioned above, it is important to maintain processing uniformity. To produce such uniformity, a stabilized plasma must be generated. A conventional plasma processing method for generating a stable plasma includes monitoring of the ground line to control the grounded state and, therefore, to improve the processing characteristics by controlling the number of ions in the plasma, which is dependent on the electrical characteristics, i.e., the current in the ground line. FIG. 9 shows a typical plasma processing method using ground line monitoring.

Referring to FIG. 9, a plasma processing apparatus includes an etching apparatus 101 and a process controller 102. The process controller 102 controls vacuum exhaust and a state of etching gas supply in the etching apparatus 101, and also controls the RF power for generating a plasma and the like. The etching apparatus 101 includes a processing chamber 103 and a stage 105. The processing chamber 103 is vacuum-sealed with a dielectric discharge pipe and microwaves are passed therethrough. The stage 105 is arranged in the lower portion of the processing chamber 103. A semiconductor wafer 104 serving as a sample is placed on and electrically insulated from the stage 105.

A mirror magnetic field is applied between the processing chamber 103 and the semiconductor wafer 104 by a solenoid coil and a permanent magnet (neither are shown). In this state, the processing chamber 103 is evacuated to produce a high vacuum. Then, process gas is introduced at a predetermined gas pressure. Furthermore, the microwaves, which are generated in a magnetron, are introduced into the processing chamber 103 through a waveguide (not shown) and are applied to the plasma excitation electrode (cathode electrode, not shown). A microwave discharge induced plasma state thereby occurs. The resonance between an electronic cyclotron motion and microwaves in the magnetic field induces the microwave discharge.

In the etching apparatus 101, the processing chamber 103 is connected to ground via a variable resistor (current control means) 111 and an ammeter (measurement means) 112. Accordingly, the ammeter 112 outputs a measured value for the ground line in the processing chamber 103. The output terminal of the ammeter 112 is connected to a computer 113. The computer 113 controls the resistance of the variable resistor 111 to a predetermined value based on the current value from the ammeter 112.

In this case, the number of ions in the plasma forms a dependent relationship with the current in the ground line. That is, the ions disappear into the wall of the grounded processing chamber 103 or the surface of parts in the processing chamber 103, and a current thus flows into the ground line. Consequently, the number of disappearing ions, that is, the number of ions in the plasma, can be controlled by controlling the current flowing into the ground line.

In general, the plasma processing apparatus described above may not start discharging until the RF voltage applied to the gap between the plasma excitation electrode 4 and the susceptor electrode 8 is exceeds a discharge starting voltage. Therefore, the RF voltage between discharge electrodes must be monitored at least when discharge starts in order to adjust the RF voltage to a level exceeding the discharge starting voltage. Heretofore, the RF voltage has been adjusted by detecting reflected waves with a directional coupler (not shown) included in the RF generator 1 and by adjusting the level of reflected waves to zero. However, in some cases, even when the level of reflected waves becomes zero by this detection method, discharge does not start. Also, this conventional monitoring method cannot detect the unevenness of discharge current density on an electrode surface, thus inhibiting the uniform plasma treatment of a workpiece.

Similarly to FIG. 8, an RF output is controlled to a predetermined value at the output terminal of the RF generator. For measuring a plasma excitation current, part of a ground line current is introduced into a bypass circuit: hence, part of the overall current, for example, only two to three percent of the overall current is used for the measurement. Thus, the plasma excitation current cannot be accurately measured.

Also, in the above-mentioned method, the bypass circuit includes a resistor for current measurement. Therefore, current loss due to impedance of this bypass circuit occurs. Accordingly, it is impossible to accurately measure the electric power used for plasma excitation.

Furthermore, in the conventional method, an output of the RF generator is adjusted to a predetermined value at a power outlet. Therefore, the power loss in the matching circuit fluctuates due to an increased temperature of a conductor caused by high-frequency current or the like, thus causing a fluctuation in effective power consumption in the plasma space. For example, the increase in temperature of the conductor causes an increase in impedance in an RF power circuit, thus resulting in a decrease in the effective electric power consumption in the plasma space. In addition, in an apparatus including a plurality of continuous plasma chambers, effective electric power consumption undesirably varies depending on the plasma space.

SUMMARY OF THE INVENTION

In order to solve the foregoing problems, embodiments of the present invention provide a plasma processing apparatus that includes a current-detecting unit that can measure a discharge current flowing in the gap between an electrode pair during plasma discharge. In alternative embodiments, the plasma processing apparatus includes a current-detecting unit and also can monitor the uniformity of plasma treatment of a workpiece.

The present invention also provides a plasma processing apparatus that can perform stable and uniform plasma treatment by directly and accurately measuring the RF power applied to a plasma excitation electrode (cathode electrode) and by controlling the RF power to a set predetermined value.

In order to solve the above problems, the present invention provides a plasma processing apparatus that includes an electrode pair having a plasma excitation electrode for forming a plasma and a susceptor electrode facing the plasma excitation electrode, a workpiece to be plasma-treated being placed therebetween; a plasma processing chamber accommodating the electrode pair; an RF generator; a feeding path for feeding RF power from the RF generator to the plasma excitation electrode; an impedance matching circuit placed in the feeding path, wherein the impedance matching circuit matches the impedance between the RF generator and the plasma processing chamber; a chassis accommodating the impedance matching circuit, wherein the chassis functions as part of a return path from the susceptor electrode to the RF generator; and a current-detecting unit in the chassis, wherein the current-detecting unit detects an RF current which returns from the susceptor electrode to the RF generator.

While not wishing to be bound by any theory, the present invention is based on the findings that the maximum RF discharge voltage can be obtained when the current flowing in the gap between the electrode pair, that is, in the plasma space, becomes maximum. An indirect but especially effective technique for measuring an RF current flowing in the plasma space involves externally detecting the RF current which returns from the susceptor electrode to the RF generator using a current-detecting unit. The current-detecting unit is provided in the chassis which accommodates the impedance matching circuit. Consequently, if the state of the plasma processing apparatus is set to achieve the maximum current value from the current-detecting unit, the maximum RF discharge voltage can be achieved in the plasma space, thus ensuring that the plasma discharge is started. In the plasma processing apparatus according to the present invention, a high-frequency current flowing in the plasma space can be measured externally (and indirectly) in the return path. Accordingly, the operational status inside the apparatus, such as whether or not a discharge voltage required for starting plasma discharge can be achieved, can be accurately determined externally.

It is preferable that a plurality of the current-detecting units be provided in the chassis, and that the current-detecting units be placed axisymmetrically around the central axis of the chassis.

The presence or absence of drift in the high-frequency current flowing around the chassis can be detected by providing a plurality of the current-detecting units placed axisymmetrically around the central axis of the chassis. If drift is detected around the chassis, the drift may exist in a discharge current flowing in the gap between the electrode pair. The state of the plasma processing apparatus is adjusted to eliminate this drift, thus enabling the drift of the discharge current to be prevented. Thus, greater uniformity in the plasma treatment effect can, therefore, be applied to the workpiece.

Although the expression "axisymmetrical" is generally defined as a state in which two points are located on a straight line which is orthogonal to the central axis and at the same distance from the central axis, a state in which a plurality of points are located at the same distance from the central axis on a plain surface which is orthogonal to the central axis and are equally spaced from each other is also included in the present invention.

Preferably, the current-detecting unit includes a slit formed in the chassis and extending along a flow path of the RF current which returns to the RF generator and a magnetic field probe for detecting a magnetic field generated at the slit.

A magnetic field is generated by the high-frequency current at the slit formed on the chassis along the high-frequency current flow path. Since the magnetic field density corresponds to the amount of high-frequency current, the size of the high-frequency current flowing in the plasma space can be measured externally by the size of the magnetic field detected by the magnetic field probe being monitored.

It is desirable that the magnetic field probe be placed close to one end of the inside edge of the slit. This is because a high-frequency current mainly flows on the inside surface of the chassis and a magnetic field closer to an edge of the slit has higher density, thus increasing the detection sensitivity.

Preferably, the width of the slit is $\lambda/100$ or less, where $\lambda$ represents the wavelength of the RF current.

A slit width exceeding $\lambda/100$ is undesirable because it causes an increase in undesirable emission by the magnetic field and this electromagnetic emission may have adverse effects on the surroundings. The lower limit of the slit width is not particularly limited, as long as the magnetic field probe can be inserted into the slit. In view of this, it is further desirable that the slit width be set to approximately $\lambda/10,000$.

It is preferable that a cross-section of the chassis cut perpendicularly to the central axis thereof is regularly polygonal or circular. It is also preferable that the plasma processing chamber and the susceptor electrode be symmetrical with respect to respective axes of symmetry thereof, and the axes each coincide with the central axis of the chassis.

Generally, uneven plasma processing is caused by the apparatus configuration, the workpiece placement, unevenly distributed plasma generation gas, or the like. Consequently, the apparatus configuration must be considered in order to minimize the unevenness of the processing by reducing drift in the high-frequency current as much as possible. If the cross-section of the chassis is regularly polygonal or circular, the density of the high-frequency current flowing in the sidewalls of the chassis is constant over the circumferential sidewall, thereby reducing or preventing drift in the discharge current flowing in the gap between the electrode pair. Moreover, if the plasma processing chamber and the susceptor electrode are also symmetrical with respect to respective axes of symmetry thereof and the axes each coincide with the central axis of the chassis, a more effective reduction or prevention of drift in the current flowing between the electrode pair is achieved.

A plasma processing apparatus according to the present invention includes a plasma processing chamber having an electrode for exciting a plasma; an RF generator for supplying RF power to the electrode; a matching circuit for impedance matching between the plasma processing chamber and the RF generator, the matching circuit including an input terminal connected to the RF generator with an RF supplier therebetween and an output terminal connected to the electrode with an RF feeder therebetween, wherein a ground potential portion is connected between the input and output terminals; a current-detecting unit for monitoring a current flowing in the RF feeder; a control unit for controlling an output of the RF generator so that a current value detected by the current-detecting unit maintains a predetermined value; and a feedback circuit for feeding back to the RF generator or the matching circuit a control signal from the control unit to adjust the electric power applied to the electrode for exciting the plasma.

By using such a plasma processing apparatus, it becomes possible to directly and accurately measure the RF power applied to the plasma excitation electrode, to control the RF power to predetermined electric power, and to perform stable and uniform plasma treatment.

In the plasma processing apparatus according to the present invention, a current probe may be used as the current-detecting unit.

Therefore, the RF power can be accurately measured by using a simple apparatus.

Also, the plasma processing method according to the present invention is executed by using the above-described apparatus. In the method, electric power applied to the electrode for exciting a plasma is controlled to maintain a predetermined value during a plasma treatment.

More specifically, in the method, a current flowing in an RF feeder and applied to the electrode for exciting the plasma may be monitored by a current-detecting unit. Also, the electric power applied to the electrode for exciting the plasma may be controlled so that the current detected by the current-detecting unit maintains a predetermined value.

By using such a plasma processing method, effective electric power consumption in the plasma space can be kept constant, so that uniform processing can be maintained when an etching process, a film deposition process, a sputtering process, or the like is performed.

DESCRIPTION OF THE PREFERRED EMBODIMENTS

Figure 1:
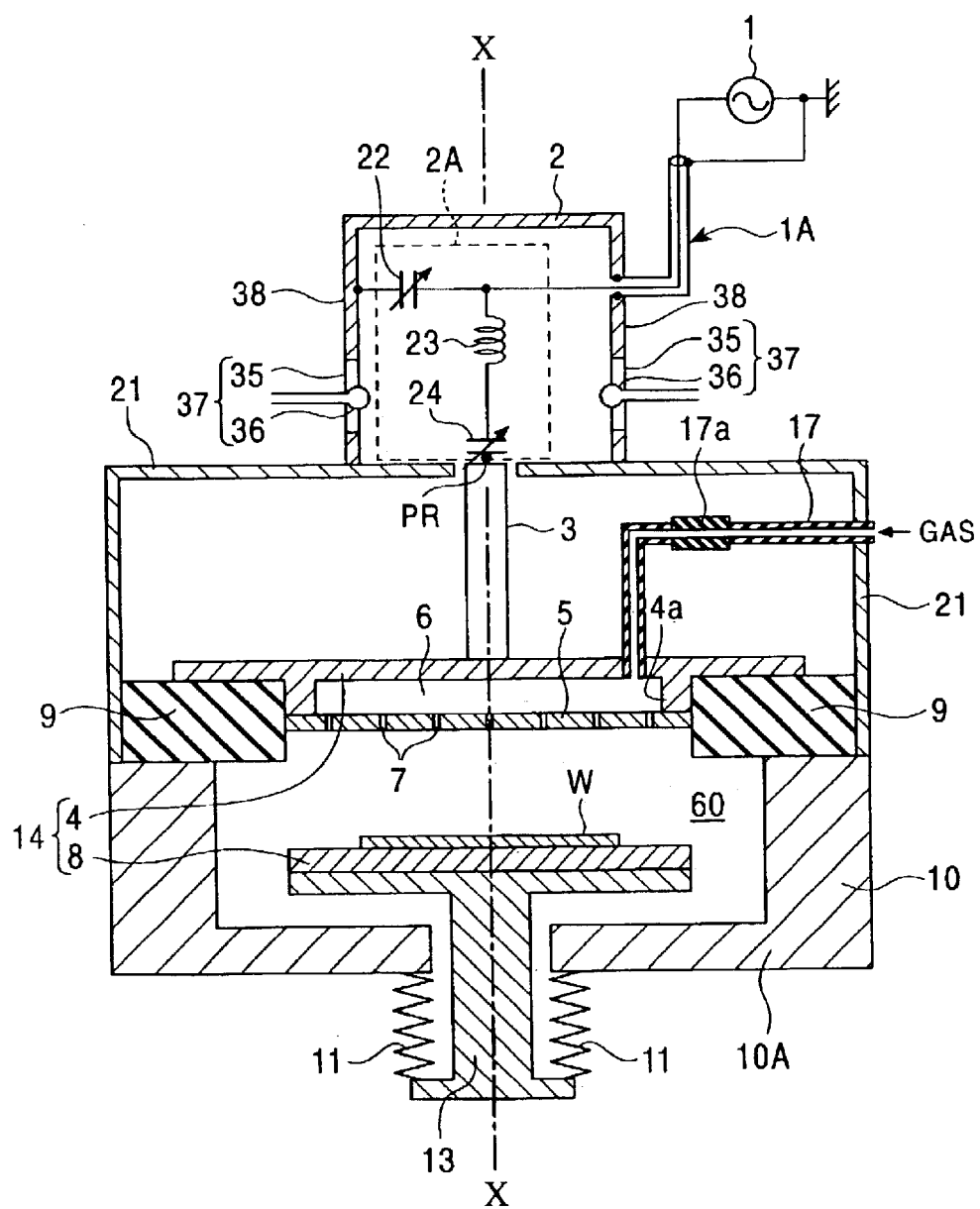
FIG. 1 is a cross-sectional view showing the configuration of a plasma processing apparatus according to one embodiment of the present invention.

Embodiments of the present invention will now be described in detail. The present invention is, however, not limited to these embodiments. The attached drawings are used for explaining the spirit and scope of the present invention. In the drawings, elements unnecessary for the description of the present invention are not depicted. Also, each element illustrated is not necessarily the same as the actual corresponding element in shape, dimensional ratio, and number.

First Embodiment

FIG. 1 is a cross-sectional view showing the configuration of a plasma processing apparatus according to a first embodiment. This plasma processing apparatus is of a single frequency excitation-type that can perform plasma treatment, such as CVD (chemical vapor deposition), sputtering, dry etching, ashing or the like. The plasma processing apparatus includes a parallel plate electrode pair 14 that includes a plasma excitation electrode 4 for forming a plasma and a susceptor electrode 8 that faces the plasma excitation electrode 4. A workpiece W to be plasma-treated is placed on the susceptor electrode 8. The plasma excitation electrode 4 is connected to a feeding terminal of an RF generator 1 with an RF feeder 3 and a matching circuit 2A therebetween.

A conductive chassis 2 accommodates the matching circuit 2A for impedance matching between the RF generator 1 and the plasma excitation electrode 4. Slits 35 described below are formed on the chassis 2. The upper surface of the plasma excitation electrode 4 and the RF feeder 3 are enclosed in a conductive housing 21. Since the housing 21 is connected to the chassis 2, the housing 21 and the chassis 2 function as an integrated chassis.

The plasma excitation electrode 4 connected to the RF generator 1 and a shower plate 5 are arranged in the upper portion of a chamber 60 serving as a plasma processing chamber in the plasma processing apparatus. The susceptor electrode 8, which faces the shower plate 5 and which carries the workpiece W, is arranged in the lower portion of the chamber 60. The plasma excitation electrode 4 is connected to the RF generator 1 via the RF feeder 3, the matching circuit 2A, and a core of a coaxial cable 1A. The housing 21 and the chassis 2 are electrically connected to each other. The chassis 2 is connected to shielding (outer conductor) of the coaxial cable 1A.

For example, a silver-plated copper plate having a width ranging from 50 to 100 mm, a thickness of 0.5 mm, and a length ranging from 100 to 300 mm is used for the RF feeder 3 in one embodiment. The RF feeder 3 is detachably attached to an output terminal of a tuning capacitor 24 in the matching circuit 2A described below and the plasma excitation electrode 4 by connecting means, such as screws.

An annular projection 4a is provided on the bottom of the plasma excitation electrode 4. The shower plate 5 has many openings 7 and is connected to the annular projection 4a, below the plasma excitation electrode 4. A space 6 is thereby formed between the plasma excitation electrode 4 and the shower plate 5. A gas inlet pipe 17 extends through a sidewall of the housing 21 and the plasma excitation electrode 4 to communicate with the space 6.

Although the gas inlet pipe 17 is made of a conductive material, the gas inlet pipe 17 has an insulating component 17a provided at the middle thereof within the housing 21. The plasma excitation electrode 4 and the gas supply source are, therefore, electrically insulated from each other. Gas introduced from the gas inlet pipe 17 is supplied into the chamber 60, surrounded by a chamber wall 10, through the openings 7 of the shower plate 5. The chamber wall 10 and the plasma excitation electrode 4 are electrically insulated from each other by a ring insulator 9. The chamber 60 is connected to an exhaust system (not shown).

The plate susceptor electrode 8 carrying the workpiece W is provided in the chamber 60. A shaft 13 is connected to the bottom center of the susceptor electrode 8. The shaft 13 extends downward through a chamber bottom 10A. The bottom of the shaft 13 and the center of the chamber bottom 10A are hermetically connected to each other by conductive bellows 11. Since the susceptor electrode 8 can move vertically with the shaft 13 and the bellows 11, the distance distance between the plasma excitation electrode 4 and the susceptor electrode 8 may be adjusted while maintaining vacuum in the chamber 60. The susceptor electrode 8 and the shaft 13 are also electrically connected to the chamber bottom 10A. Consequently, the susceptor electrode 8, the shaft 13, the bellows 11, the chamber bottom 10A, and the chamber wall 10 have the same DC potential. Furthermore, since the chamber wall 10 is electrically connected to both the housing 21 and the chassis 2, the chamber wall 10, the housing 21, and the chassis 2 all have the same DC potential.

In the plasma processing apparatus according to this embodiment shown in FIG. 1, the chassis 2, the housing 21, the chamber wall 10, the bellows 11, the shaft 13, and the susceptor electrode 8 are arranged so that each of them is axisymmetrical around the common axial line X—X.

The matching circuit 2A matches the impedance in accordance with changes in the plasma state and the like within the chamber 60. As shown in FIG. 1, the matching circuit 2A is disposed between the RF generator 1 and the RF feeder 3, and includes an inductance coil 23, the tuning capacitor 24 (an air variable capacitor), and a load capacitor 22 (a vacuum variable capacitor). The inductance coil 23 and the tuning capacitor 24 are connected in series from an input terminal side to an output terminal side of the matching circuit 2A. The load capacitor 22 is disposed between an input node of the inductance coil 23 and the chassis 2 (common potential portion). The inductance coil 23 and the tuning capacitor 24 are preferably directly connected to each other without any conductive material therebetween. The tuning capacitor 24 serves as an output terminal unit of the matching circuit 2A, and an output terminal PR thereof is connected to the plasma excitation electrode 4 with the RF feeder 3 therebetween.

Figure 2:
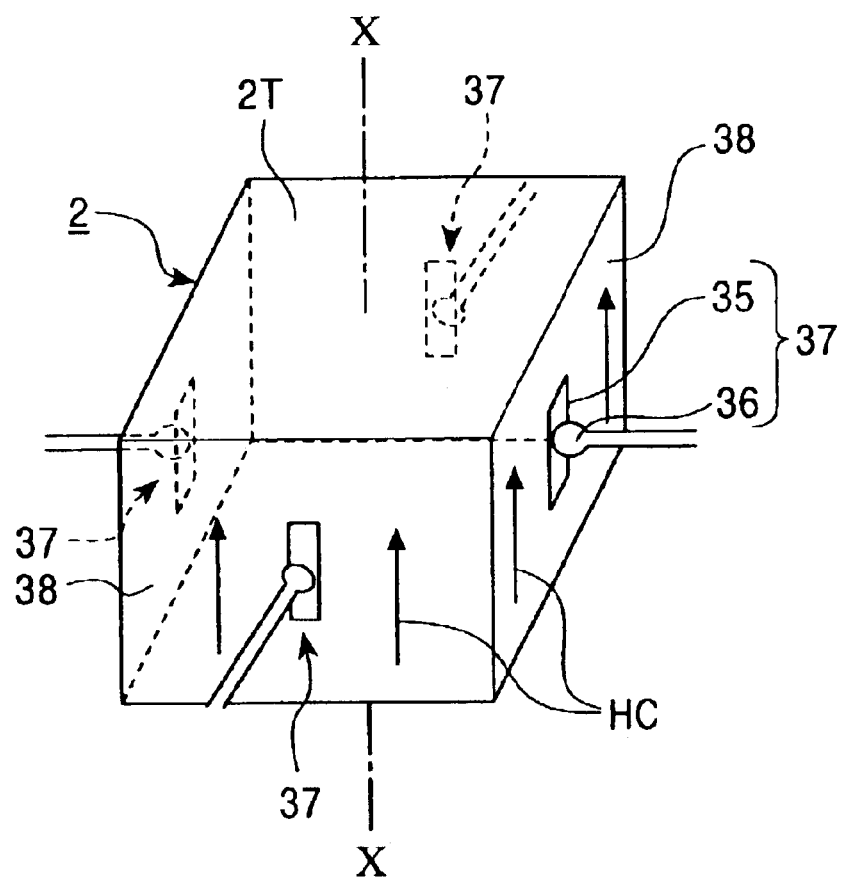
FIG. 2 is a perspective view showing the configuration of a chassis according to one embodiment of the present invention.

FIG. 2 is a perspective view showing the configuration of the chassis 2 according to this embodiment. The chassis 2 is preferably made of an aluminum alloy. The chassis 2 preferably has a box shape with a square top plate 2T. The central axis of the chassis 2 passing through the center of the top plate 2T corresponds to the axial line X—X of the plasma processing apparatus shown in FIG. 1. The slits 35 extending in the direction parallel to the axial line X—X are formed at the center of the surface of the respective four sidewalls 38 of the chassis 2. Each of the slits 35 is preferably disposed at the center of the corresponding sidewall 38 in such a manner that two slits facing each other are placed axisymmetrically around the axial line X—X. In other words, the four slits 35 are placed at the same distance from the axial line X—X and are equally spaced from each other.

Each of the slits 35 has, for example, a length of 3 cm. This example is intended to be illustrative and not limiting. Thus, the length of the slits may vary without departing from the scope and spirit of the invention. The width of each slit 35 is designed so as to be $\lambda/1,000$ in one embodiment, where the wavelength of RF power supplied to the plasma processing apparatus is represented by $\lambda$. For example, if the frequency of the RF power is 40.68 MHz, the wavelength $\lambda$ is 7.37 m. The width of the slits 35 is therefore, according to one embodiment, 7.37 mm.

Looped magnetic field probes 36 are arranged in the corresponding slits 35. The magnetic field probes 36 are arranged so that high-frequency currents HC flowing on the inside surface of the chassis 2 during the operation of the plasma processing apparatus are orthogonal to the direction of magnetic fields generated at the edges of the slits 35. In addition, the magnetic field probes 36 are preferably arranged at positions as near as possible to the edges of the slits so as to be strongly influenced by the magnetic fields. Each of the magnetic field probes 36 is preferably connected to a data processing and display device (monitor device), which is not shown. Of course, the magnetic field probes may be connected to any suitable monitoring device or combination of monitoring and control device, for example such as a general purpose computer, without departing form the spirit and scope of the present invention. The combination of the slit 35 and the magnetic field probe 36 constitutes current-detecting means 37 according to this embodiment.

Referring to FIG. 1, the output terminal (high tension side) of the RF generator 1 and the matching circuit 2A are connected to each other by the core of the coaxial cable 1A. One end of the shielding of the coaxial cable 1A is connected to the chassis 2, and the other end of the shielding is connected to the common terminal of the RF generator 1. Since the common terminal of the RF generator 1 is grounded, return paths formed by the susceptor electrode 8, the shaft 13, the bellows 11, the chamber wall 10, the housing 21, the chassis 2, and the shielding of the coaxial cable 1A are DC-grounded. Also, one end of the load capacitor 22 is DC-grounded.

Plasma treatment of the workpiece W using the plasma processing apparatus according to this embodiment will now be described. Referring to FIG. 1, the workpiece W is placed on the susceptor electrode 8. It is preferable that the center of the surface of the workpiece W be disposed so as to coincide with the axial line X—X of the plasma processing apparatus. Then, the chamber 60 is evacuated to a predetermined degree of vacuum, plasma generation gas is introduced from the gas inlet pipe 17, and RF power is supplied from the RF generator 1. The operating conditions, such as the degree of vacuum, the kind of plasma generation gas, the pressure within the processing chamber, the frequency of RF power, the electric power, and the like, vary depending on the purpose of the plasma treatment performed on the workpiece W, the efficiency of the apparatus, and the like. These conditions are similar to the operating conditions for known plasma processing apparatuses. Thus, a detailed explanation of the conditions is omitted here.

The RF power (high tension side) supplied from the RF generator 1 is fed to the matching circuit 2A via the core of the coaxial cable 1A. Then, the RF power is fed from the output terminal PR and is then supplied to the plasma excitation electrode 4 via the RF feeder 3. Since the plasma excitation electrode 4 faces the susceptor electrode 8, which is at the ground side, vacuum discharge is generated within the chamber 60. The gas introduced from the gas inlet pipe 17 into the chamber 60 is excited by vacuum discharge and thus plasma is generated. The generated plasma passes through the openings 7 formed in the shower plate 5 and impinges on the workpiece W in a shower pattern. Accordingly, a predetermined plasma treatment is performed on the surface of the workpiece W.

At this time, a potential difference corresponding to a discharge voltage is generated between the plasma excitation electrode 4 and the susceptor electrode 8. In contrast, each of the shaft 13, the bellows 11, the chamber bottom 10A, the chamber wall 10, the housing 21, and the chassis 2, which together serve as a return path for returning from the susceptor electrode 8 to the common side of the RF generator 1, has AC electrical resistance, that is to say, impedance. Therefore, although the susceptor electrode 8 is DC-grounded, the susceptor electrode 8 is at an AC potential corresponding to the current flowing in the impedance. A high-frequency current flows from the susceptor electrode 8 to the common side of the RF generator 1. The high-frequency current is believed to spread out the entire inside surface of the conductive portions, such as the chamber wall 10, the housing 21, and the chassis 2.

Referring to FIG. 2, since the slits 35 in the chassis 2 are arranged along the directions in which the high-frequency currents HC flow, magnetic fields are generated at the edges of the slits by the high-frequency currents. The magnetic field probes 36 detect these magnetic fields. The magnetic field strengths correspond to the value of the current flowing in the gap between the electrode pair, and the value of the current between the electrode pair corresponds to the discharge voltage of the electrode pair. Consequently, monitoring the magnetic field strengths by the current-detecting means 37 enables detection of, for example, whether or not an appropriate discharge voltage for starting discharge is achieved.

Figure 3:
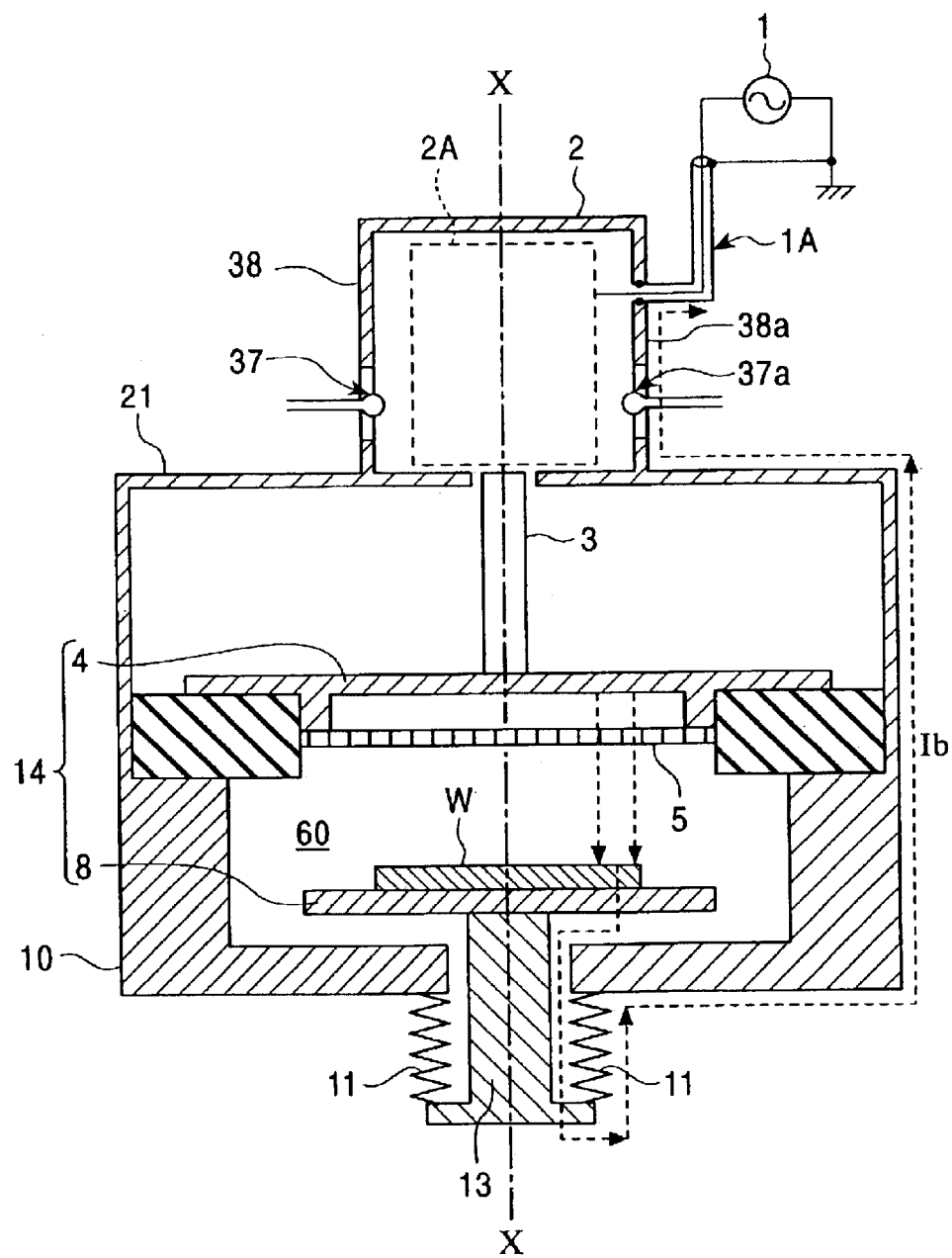
FIG. 3 is an illustration schematically showing measurement of a high-frequency current drift in a plasma processing apparatus according to one embodiment of the present invention.

The four current-detecting means 37 provided in the chassis 2 are preferably placed at the same distance from the axial line X—X and are equally spaced from each other, that is to say, they are arranged axisymmetrically. As shown in FIG. 3, if a magnetic field strength detected by current-detecting means 37a provided on a particular sidewall 38a of the chassis 2 differs from that of the other surfaces, it is predicted that there will be a drift in the discharge current flowing in the gap between the electrode pair 14, as indicated by the dotted arrow Ib in FIG. 3. There is, therefore, a possibility that an nonuniform plasma treatment is performed on the workpiece W. In other words, monitoring and comparing the four current-detecting means 37, allows the uniformity of the plasma treatment of the workpiece W to be monitored externally.

Each of the chassis 2 and the housing 21 is arranged axisymmetrically around the axial line X—X and they are electrically continuous. Substantially similar effects can thus be obtained even if the four current-detecting means 37 are arranged on the walls of the housing 21 instead of the walls of the chassis 2. Consequently, the chassis 2 according to the present invention includes the housing 21 according to this embodiment. That is, the scope of the present invention is intended to extend to current detecting means arranged anywhere on the walls of the chassis 2 or the housing 21 portion of the chassis 2.

Second Embodiment

A plasma processing apparatus according to a second embodiment is similar to that of the first embodiment with the exception that the shape of the chassis 2 differs. Only the shape of the chassis 2 in this embodiment will now be described in detail.

Figure 4:
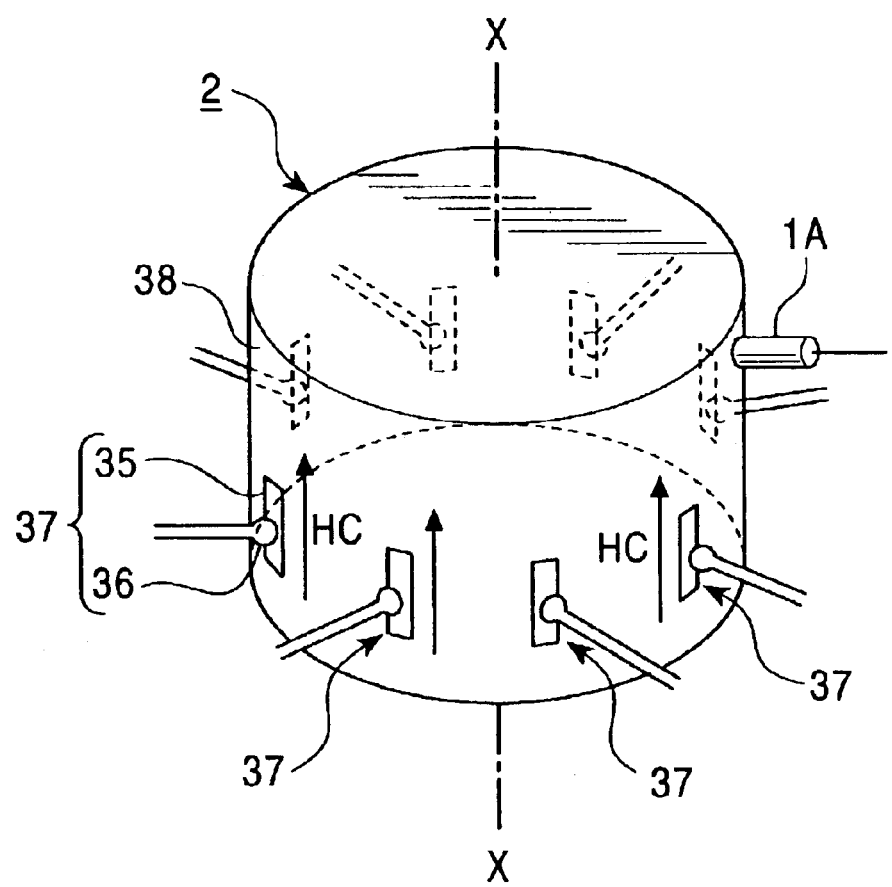
FIG. 4 is a perspective view of a chassis used for a plasma processing apparatus according to another embodiment of the present invention.

FIG. 4 is a perspective view of the chassis 2 in the plasma processing apparatus according to this embodiment. The chassis 2 in this embodiment has a cylindrical shape, and eight current-detecting means 37 are arranged axisymmetrically around the axial line X—X on the sidewalls 38 of this chassis 2. Each current-detecting means 37 includes a slit 35 and a magnetic field probe 36. These slits 35 extending in the direction parallel to the axial line X—X are of the same shape as described with respect to the first embodiment and preferably, each of the slits has the same shape as the others. Further, the slits 35 are placed at the same distance from the axial line X—X and are equally spaced from each other on the sidewalls 38 of the chassis 2. The looped magnetic field probes 36 are arranged in the corresponding slits 35. The magnetic field probes 36 are arranged so that high-frequency currents HC flowing on the inside surface of the chassis 2 during the operation of the plasma processing apparatus are orthogonal to the direction of the magnetic fields generated at the edges of the slits 35. In addition, the magnetic field probes 36 are preferably installed at positions as near as possible to the edges so as to be strongly influenced by the magnetic fields.

In this embodiment, eight current-detecting means 37 are provided on the chassis 2 so that they are placed at the same distance from the axial line X—X and are equally spaced from each other. Therefore, drift in the high-frequency current HC flowing on the inside surface of the chassis 2 in this embodiment can be detected more accurately than in the first embodiment. That is, the greater number of current detection means better enable detection of current drift. Consequently, drift in the discharge current flowing in the gap between the electrode pair 14 can be monitored more accurately. Although eight current-detecting means are illustrated, these are provided for illustrative purposes and are not intended to be limiting. For example, more than eight current-detecting means may be provided on the chassis 2 and equally spaced form each other and therefore providing even better accuracy without departing form the spirit and scope of the present invention.

Although the chassis 2 in this embodiment has a cylindrical shape, the chassis 2 may be any regular polygonal prism or body of revolution whose central axis coincides with the axial line X—X of the electrode pair 14. If the chassis 2 having these shapes includes a plurality of the current-detecting means 37 arranged axisymmetrically around the axial line X—X, the RF voltage at the electrode pair 14 can be measured and the drift state at the electrode pair 14 can be monitored externally.

In the plasma processing apparatus according to the embodiments described above, the material of each member, such as the chassis 2, the housing 21, and the chamber wall 10, is generally aluminum, stainless steel, or the like. Although the invention is not so limited. A low-resistance conductive path which has lower resistance to a high-frequency current may be provided on the inside surface of the members. Providing the low-resistance conductive path enables a further reduction in loss of the RF power supplied into the space where plasma is generated. It is preferable that the low-resistance conductive path be made from gold, silver, copper, or an alloy including at least these metals. The low-resistance conductive path may cover the entire inside surface of each of the members. One or more low-resistance conductive paths having, for example, line or band shapes may be placed from the susceptor electrode 8 to the RF generator 1 passing through the surfaces of these members. Where a plurality of the low-resistance conductive paths are provided, it is preferable that these paths be arranged in parallel so as to be axisymmetrical around the axial line X—X. In any case, if a low-resistance conductive path is provided, preferably a current-detecting means 37 is arranged on the low-resistance conductive path.

In the plasma processing apparatus according to this embodiment, the surfaces of the chassis 2, the housing 21, the chamber wall 10, the chamber bottom 10A, the bellows 11, and the like may be covered with insulating films made of insulating materials, if necessary. Polyimide, PFA (tetrafluoroethylene-perfluoroalkylvinyl ether copolymer), PTFE (polytetrafluoroethylene), ETFE (tetrafluoroethylene-ethylene copolymer), or the like, may be used as the insulating films. Polyimide, PFA, and PTFE have excellent heat resistance, and ETFE has excellent wear resistance. Consequently, it is desirable that these materials be appropriately chosen depending on the purpose or application. Alternatively, a multilayer film be formed using these materials.

In the plasma processing apparatus according to this embodiment, application of RF power of a frequency of approximately 13.56 MHz or more, and more specifically, 13.56 MHz, 27.12 MHz, 40.68 MHz, or the like, enables plasma treatment, such as CVD, dry etching, and ashing to be performed on the workpiece W placed on the susceptor electrode 8 by plasma generated between the electrode pair 14.

For plasma treatment, such as RIE (reactive ion etching) or the like, the workpiece W may alternatively be installed at the plasma excitation electrode 4 instead of being placed on the susceptor electrode 8. In addition, the configuration of the electrode pair may be an ICP (inductively coupled plasma) type, an RLSA (radial line slot antenna) type, or the like, instead of the parallel plate type. All of these variations are intended to be within the scope and spirit of the present invention and are not themselves to be interpreted as limiting.

Preferably, an operator sets, in accordance with the workpiece W, various processing sequences and processing conditions, such as film deposition conditions, annealing conditions, and heat treatment conditions, in the plasma processing apparatus having the arrangement described above. A controller (not shown), however, preferably controls the operation of each part for automatic operation. Consequently, in using the plasma processing apparatus, the workpiece W to be processed is set into a loader cassette (not shown). The operator turns on a start switch and a carrier robot carries the workpiece W from the loader cassette to the chamber 60. After a series of processing steps are automatically performed, the carrier robot puts the processed workpiece W in an unloader cassette.

Third Embodiment

Figure 5:
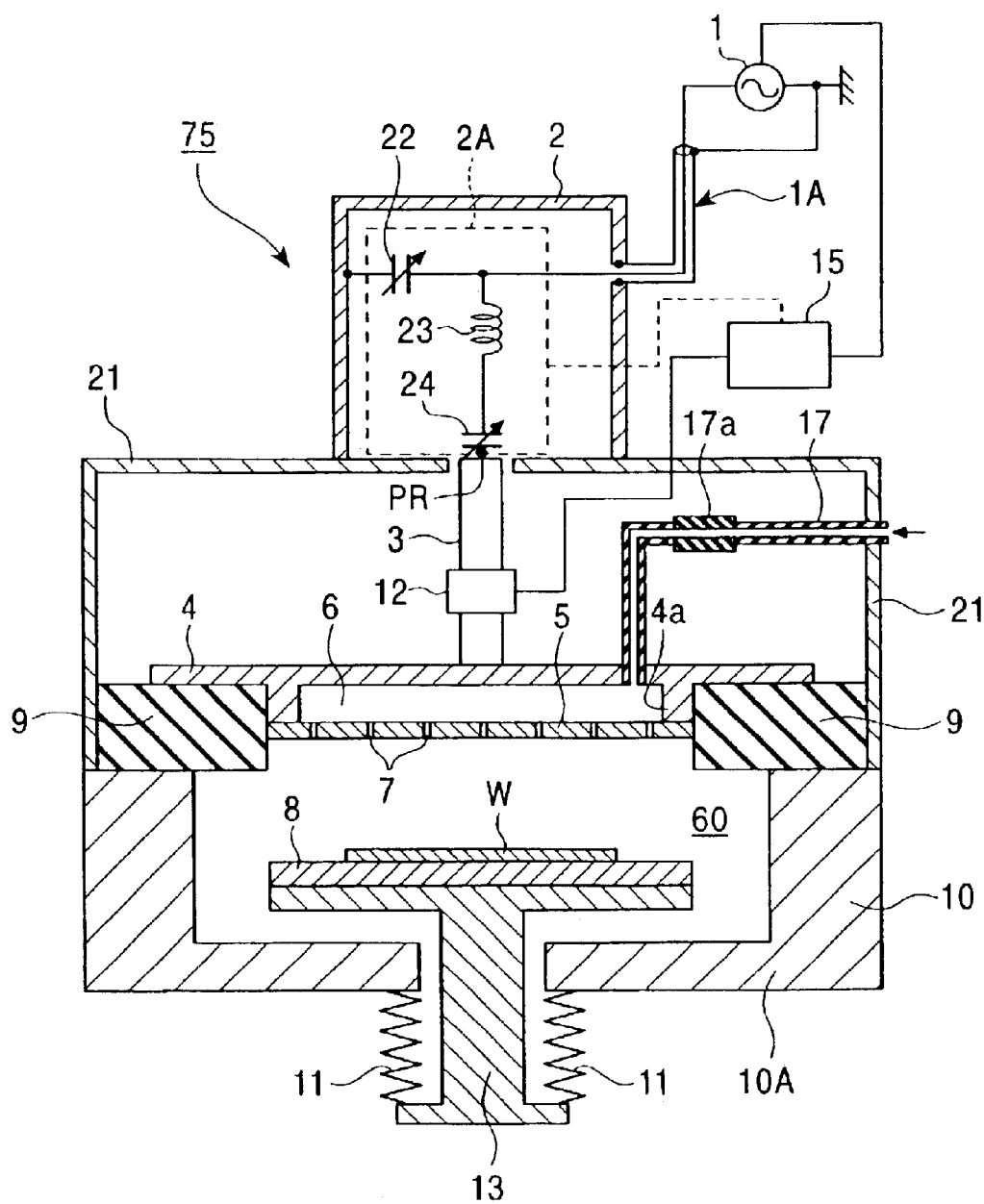
FIG. 5 is a cross-sectional view schematically showing the configuration of a plasma processing apparatus according to one embodiment of the present invention.

FIG. 5 is a cross-sectional view schematically showing the configuration of a plasma processing apparatus according to a third embodiment of the present invention.

Figure 8:
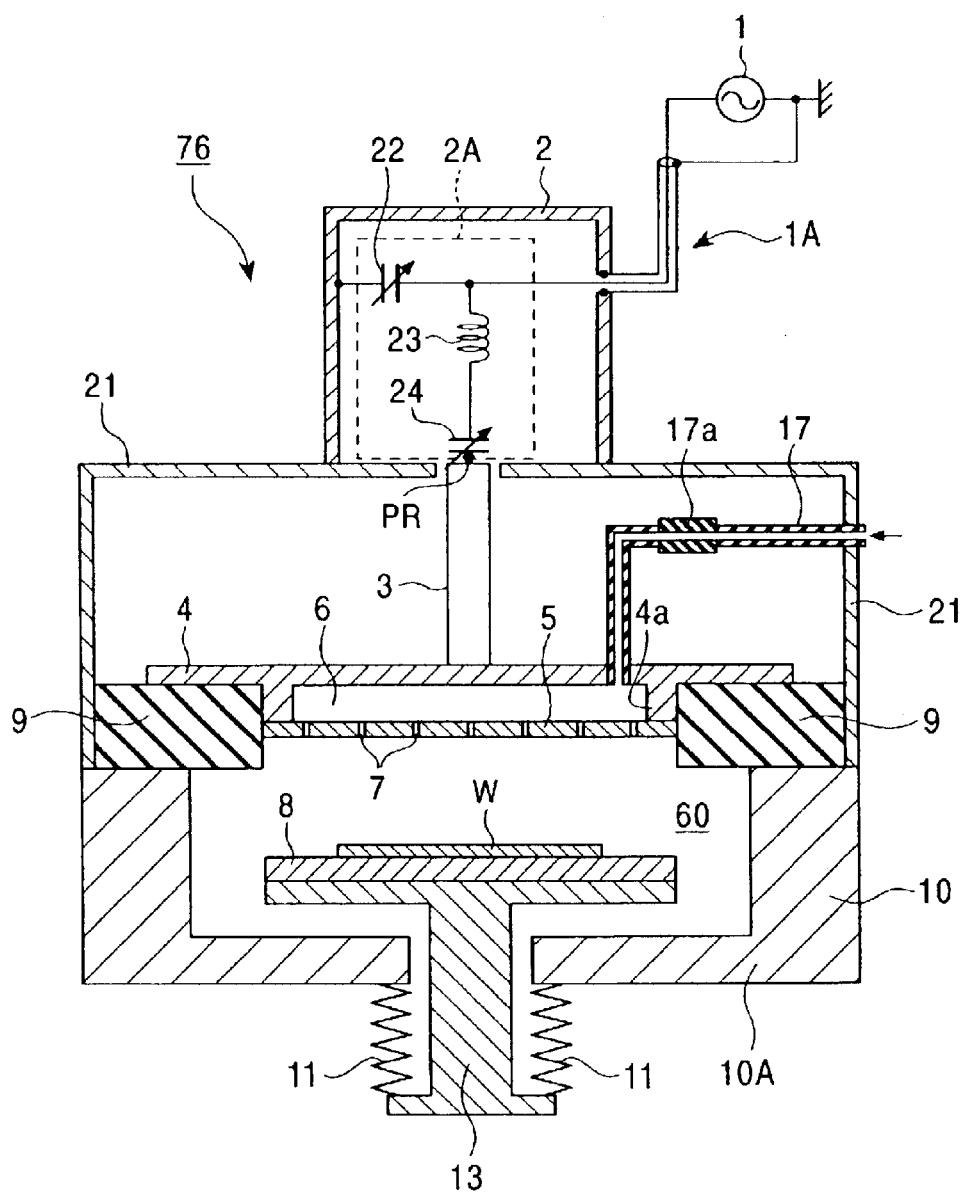
FIG. 8 is a cross-sectional view schematically showing an example of the configuration of the plasma processing apparatus according to the related art.
Figure 9:
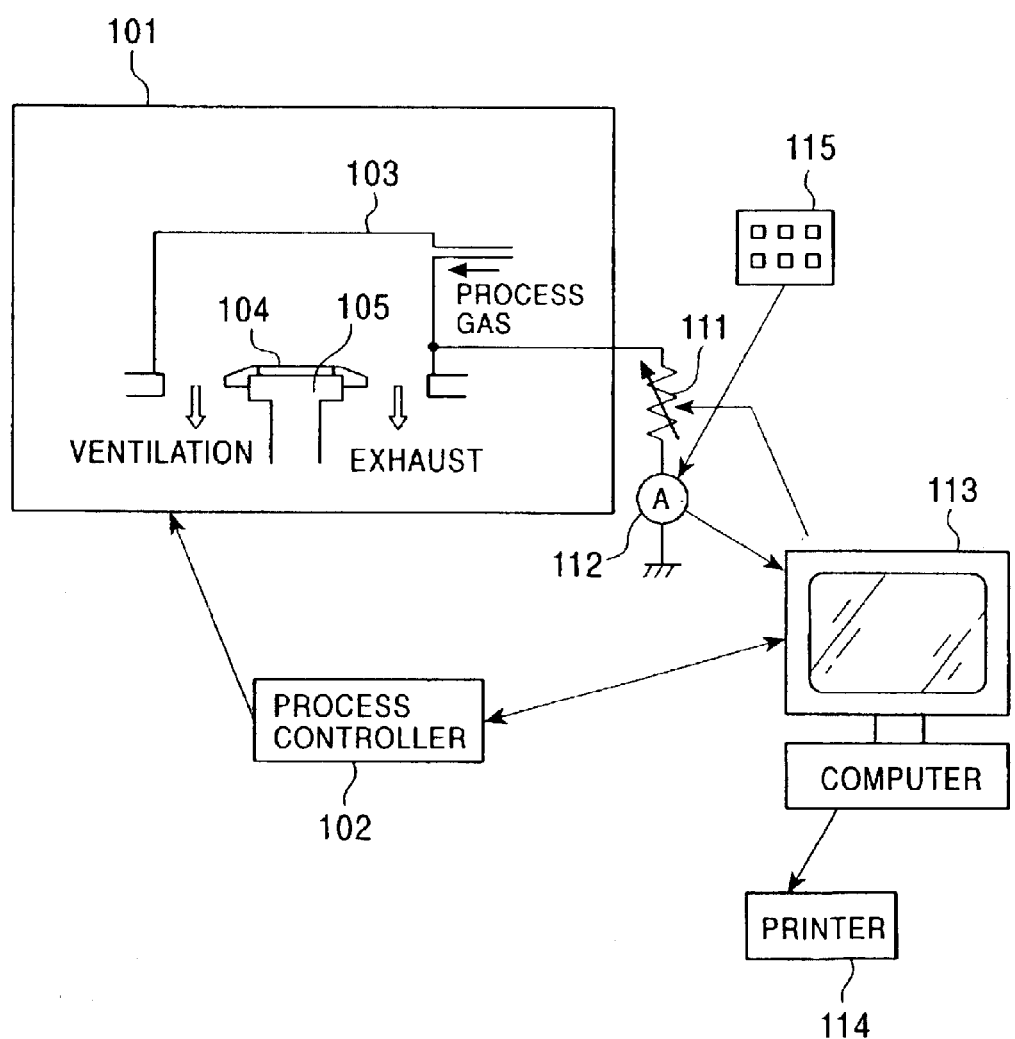
FIG. 9 is a cross-sectional view schematically showing another example of the configuration of the plasma processing apparatus according to the related art.

The main configuration of the plasma processing apparatus according to the present invention is similar to the conventional plasma processing apparatus shown in FIG. 8. Parts having the same functions as in FIG. 8 are referred to with the same reference numerals. The plasma processing apparatus according to the present invention is different from the conventional plasma processing apparatus shown in FIG. 8 in that current-detecting means installed on an RF feeder detects a high-frequency current in order to control the RF power applied to the plasma excitation electrode to a predetermined value. The control circuit will now be described.

In the plasma processing apparatus according to the present invention, as shown in FIG. 5, a current probe such as a clamp meter 12 installed on an RF feeder 3 for applying a high-frequency current to a plasma excitation electrode 4 detects the size of the current flowing in the RF feeder 3 and inputs the detected current to a control circuit 15.

The control circuit 15 calculates the difference between the detected current and a predetermined value provided beforehand, produces a signal for increasing or decreasing the output of an RF generator 1 until the difference becomes zero, and feeds back this signal to the RF generator 1 or a matching circuit 2A. According to one method, the output of the RF generator 1 is increased or decreased in accordance with the signal fed back to the RF generator 1. According to another method, the RF power applied to the plasma excitation electrode 4 is adjusted by varying the capacitance of a load capacitor 22 or a tuning capacitor 24 in the matching circuit 2A in accordance with the signal fed back to the matching circuit 2A. Accordingly, the difference between the detected current and the predetermined current value is controlled so as to minimize the difference by repeating the current detection and the feedback of the control signal.

Figure 6:
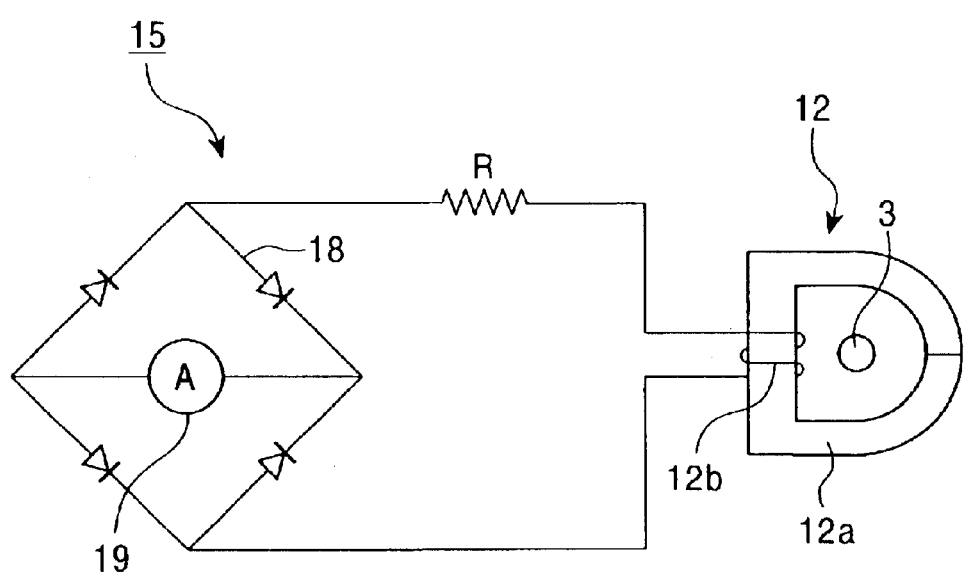
FIG. 6 is a schematic diagram illustrating a control circuit and method in the plasma processing apparatus in FIG. 5.
Figure 7:
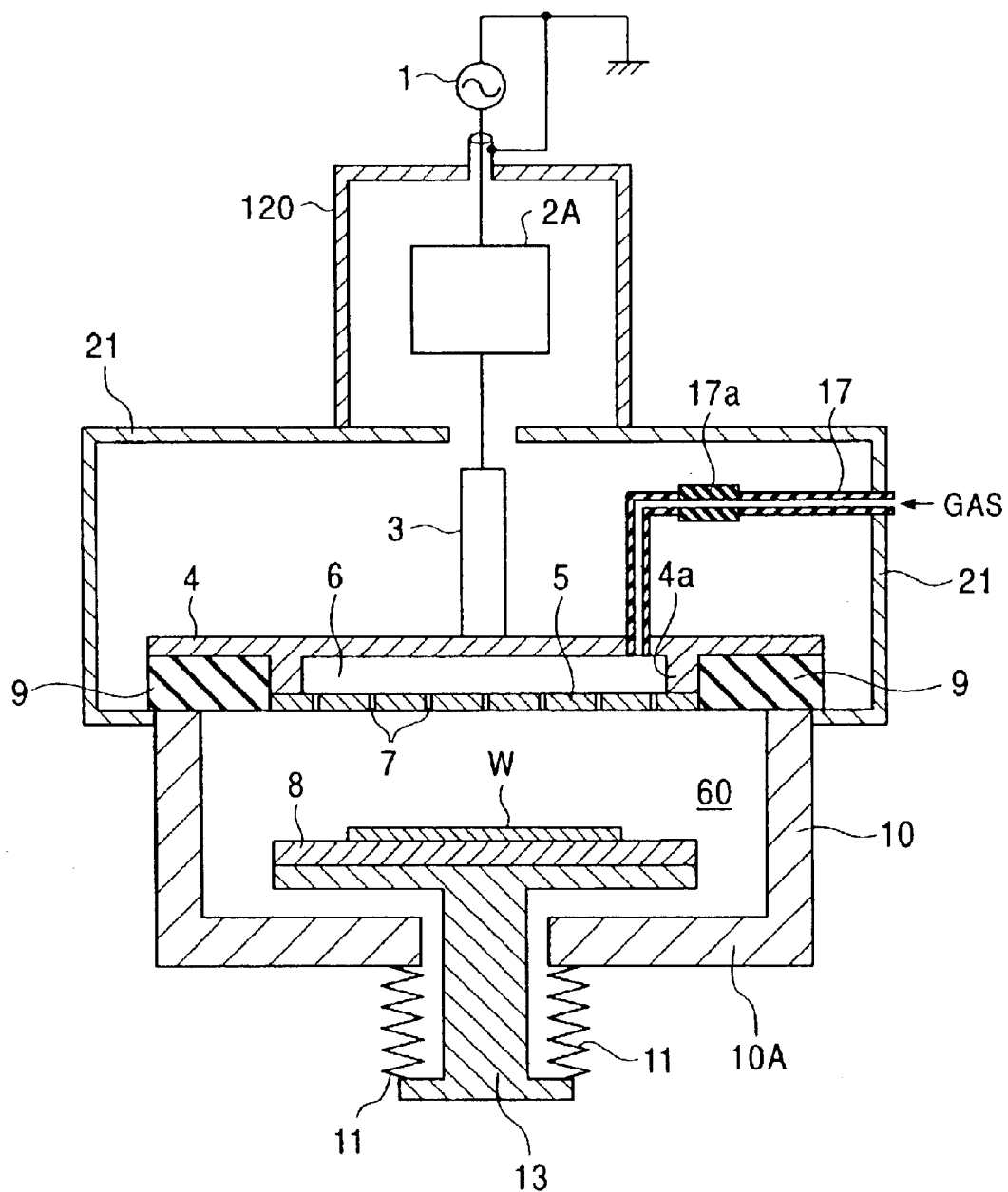
FIG. 7 is a cross-sectional view showing an example of a plasma processing apparatus according to the related art.

FIG. 6 shows an example of the configuration of the control circuit 15. Referring to FIG. 6, the clamp meter 12 including a coil 12a is installed on the RF feeder 3. The clamp meter 12 may be of a stationary-type which is installed beforehand. Also, the clamp meter 12 may be of a movable-type in which the coil 12a can be installed, when needed, be on the openable and closable clamp meter 12.

A coil 12b having a different number of windings is installed on the coil 12a, and the current in the coil 12a induces a current in the coil 12b. The induced current is detected by a bridge circuit 18. The difference between the predetermined current value and the current detected by an ammeter 19 in the bridge circuit 18 is adjusted to zero. The control circuit 15, which sends a control signal in accordance with the output from the ammeter 19, feeds back the control signal to the RF generator 1 or the matching circuit 2A.

A plasma processing method using the plasma processing apparatus according to the present invention will now be described.

In the plasma processing method according to the present invention, a method is adopted in which electric power applied to an electrode for exciting a plasma is controlled to maintain a predetermined value during a plasma treatment. More specifically, a current-detecting means monitors a current flowing in an RF feeder and applied to the electrode for exciting the plasma, and plasma treatment is performed so that the current detected by the current-detecting means is controlled to a predetermined value.

In the plasma processing method according to the present invention, since the RF power applied to the electrode for exciting the plasma is directly detected and adjusted to maintain the predetermined value, compensation maybe achieved for losses occurring in various parts of the circuit. For example, compensation may be made for the fluctuation of the effective electric power actually consumed in the plasma space. This fluctuation may be caused by fluctuations of the electric power loss in a matching circuit due to an increased temperature of a conductor when high-frequency current flows. Furthermore, in an apparatus including a plurality of continuous plasma chambers, the effective electric power consumption in a plurality of plasma processing spaces can be kept constant by monitoring each of the plurality of plasma spaces.

According to such a plasma processing method, processing uniformity can be maintained when an etching process, a film deposition process, a sputtering process, or the like is performed.

What is claimed is:

1. A plasma processing apparatus, comprising:
   an electrode pair of a plasma excitation electrode for forming a plasma and a susceptor electrode facing the plasma excitation electrode, a workpiece to be plasma-treated being placed therebetween;
   a plasma processing chamber accommodating the electrode pair;
   an RF generator;
   a feeding path for feeding RF power from the RF generator to the plasma excitation electrode;
   an impedance matching circuit placed in the feeding path, wherein the impedance matching circuit matches the impedance between the RF generator and the plasma processing chamber;
   a chassis accommodating the impedance matching circuit, wherein the chassis functions as part of a return path from the susceptor electrode to the RF generator; and
   current-detecting means for detecting an RF current which returns from the susceptor electrode to the RF generator, the current-detecting means being provided in the chassis.

2. A plasma processing apparatus according to claim 1, wherein a plurality of the current-detecting means is provided in the chassis, and wherein the current-detecting means are placed axisymmetrically around the central axis of the chassis.

3. A plasma processing apparatus according to claim 2, wherein the each of the plurality of current detecting means is disposed on a low resistance conductive path disposed on a surface of the chassis.

4. A plasma processing apparatus according to claim 2, wherein the a cross-section of the chassis cut perpendicularly to the central axis thereof is a regular polygon and the plurality of current detecting means comprises a plurality of slits formed in the sidewalls of the chassis.

5. A plasma processing apparatus according to claim 4, wherein the plurality of slits are formed in the center of the sidewalls.

6. A plasma processing apparatus according to claim 1, wherein the current-detecting means includes:
   a slit formed in the chassis and extending along a flow path of the RF current which returns to the RF generator; and
   a magnetic field probe for detecting a magnetic field generated at the slit.

7. A plasma processing apparatus according to claim 6, wherein the width of the slit is $\lambda/100$ or less, where $\lambda$ represents the wavelength of the RF current.

8. A plasma processing apparatus according to claim 6, wherein the width of the slit is $\lambda/1000$ or less, where $\lambda$ represents the wavelength of the RF current.

9. A plasma processing apparatus according to claim 6, wherein the magnetic field probe is arranged in the slit.

10. A plasma processing apparatus according to claim 1, wherein a cross-section of the chassis cut perpendicularly to the central axis thereof is one of a regular polygon or a circle.

11. A plasma processing apparatus according to claim 1, wherein the plasma processing chamber is symmetrical with respect to an axis, and the axis coincides with the central axis of the chassis.

12. A plasma processing apparatus according to claim 1, wherein the susceptor electrode is symmetrical with respect to an axis, and the axis coincides with the central axis of the chassis.

13. A plasma processing apparatus according to claim 1, wherein the chassis includes a housing portion enclosing the plasma processing chamber.

14. A plasma processing apparatus according to claim 13, wherein the current-detecting means are provided in the housing portion of the chassis.

15. A plasma processing apparatus, comprising:
   a plasma processing chamber having an electrode for exciting a plasma;
   an RF generator for supplying RF power to the electrode;
   a matching circuit for impedance matching between the plasma processing chamber and the RF generator, the matching circuit including an input terminal connected to the RF generator with an RF supplier therebetween and an output terminal connected to the electrode with an RF feeder therebetween, wherein a ground potential portion is connected between the input and output terminals;
   current-detecting means for monitoring a current flowing in the RF feeder;
   control means for controlling an output of the RF generator so that a current value detected by the current-detecting means maintains a predetermined value; and
   a feedback circuit for feeding back to one of the RF generator and the matching circuit a control signal from the control means to adjust the electric power applied to the electrode for exciting the plasma.

16. A plasma processing apparatus according to claim 15, wherein the current-detecting means comprises a current probe.

17. A plasma processing method using a plasma processing apparatus, comprising:

applying electric power to an electrode for exciting a plasma to maintain a predetermined value; and monitoring by a current-detecting unit provided in the chassis the current that returns from the susceptor electrode to the RF generator;

wherein the electric power applied to the electrode for exciting the plasma is controlled so that the current detected by the current-detecting unit maintains a predetermined value, and wherein the control circuit is configured to send a control signal responsive to the difference between a predetermined current value and a current detected by the current-detecting means.

18. A plasma processing apparatus, comprising:

a plasma processing chamber accommodating a plasma excitation electrode and a susceptor electrode;

an RF generator;

a feeding path for feeding RF power from the RF generator to the plasma excitation electrode;

an impedance matching circuit placed in the feeding path, wherein the impedance matching circuit matches the impedance between the RF generator and the plasma processing chamber;

a chassis enclosing the impedance matching circuit, wherein the chassis functions as part of a return path from the susceptor electrode to the RF generator; and a current-detector configured to detect an RF current which returns from the susceptor electrode to the RF generator, the current-detector being provided in the chassis.

19. A plasma processing method in a system including an electrode pair of a plasma excitation electrode for forming a plasma and a susceptor electrode facing the plasma excitation electrode, a workpiece to be plasma-treated being placed therebetween; a plasma processing chamber accommodating the electrode pair; and an RF generator, the method comprising:

feeding RF power from the RF generator to the plasma excitation electrode in a feeding path;

matching the impedance between the RF generator and the plasma processing chamber in the feeding path;

providing a return path from the susceptor electrode to the RF generator; and detecting an RF current which returns from the susceptor electrode to the RF generator in the return path.

* * * * *